(12) United States Patent
Kadowaki et al.

(10) Patent No.: US 11,930,601 B2
(45) Date of Patent: Mar. 12, 2024

(54) METHOD FOR MANUFACTURING PRINTED WIRING BOARD

(71) Applicant: IBIDEN CO., LTD., Gifu (JP)

(72) Inventors: Yuji Kadowaki, Ogaki (JP); Tomomi Kano, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/679,525

(22) Filed: Feb. 24, 2022

(65) Prior Publication Data

US 2022/0304166 A1 Sep. 22, 2022

(30) Foreign Application Priority Data

Mar. 16, 2021 (JP) ................. 2021-042012

(51) Int. Cl.
- *H05K 3/46* (2006.01)
- *H05K 3/10* (2006.01)
- *H05K 3/14* (2006.01)

(52) U.S. Cl.
CPC ........... *H05K 3/4629* (2013.01); *H05K 3/106* (2013.01); *H05K 3/108* (2013.01); *H05K 3/143* (2013.01);
(Continued)

(58) Field of Classification Search
CPC .. H05K 3/108; H05K 3/143; H05K 2203/068; H05K 2203/0143;
(Continued)

(56) References Cited

U.S. PATENT DOCUMENTS

| | | | | |
|---|---|---|---|---|
| 5,344,893 | A | * | 9/1994 | Asai ............... H05K 2203/0143 428/209 |
| 6,070,322 | A | * | 6/2000 | Case ............... H05K 2203/068 29/846 |

(Continued)

FOREIGN PATENT DOCUMENTS

| | | |
|---|---|---|
| JP | 2001-113629 A | 4/2001 |
| JP | 2016215458 A * | 12/2016 |

OTHER PUBLICATIONS

Gonzalez et al., "Epoxy-based aqueous-processable photodielectric dry film and conductive ViaPlug for PCB build-up and IC packaging," in IEEE Transactions on Advanced Packaging, vol. 22, No. 3, pp. 385-390, Aug. 1999. (Year: 1999).*

*Primary Examiner* — A. Dexter Tugbang
(74) *Attorney, Agent, or Firm* — Oblon, McClelland, Maier & Neustadt, L.L.P.

(57) ABSTRACT

A method for manufacturing a printed wiring board includes forming a seed layer on a surface of a resin insulating layer, applying a dry film onto the seed layer using a laminating roll device, cutting the dry film applied onto the seed layer to a predetermined size, applying pressure and heat to the dry film, forming a plating resist on the seed layer from the dry film using photographic technology, forming an electrolytic plating film on part of the seed layer exposed from the resist, removing the resist from the seed layer, and removing the part of the seed layer exposed from the electrolytic plating film. The applying of the pressure and heat includes applying the pressure and heat to the dry film applied onto the seed layer such that the pressure and heat are applied to the entire surface of the dry film cut to the predetermined size simultaneously.

20 Claims, 3 Drawing Sheets

(52) U.S. Cl.
CPC ... *H05K 3/4602* (2013.01); *H05K 2203/0143* (2013.01); *H05K 2203/0235* (2013.01); *H05K 2203/065* (2013.01); *H05K 2203/068* (2013.01); *H05K 2203/08* (2013.01)

(58) Field of Classification Search
CPC ..... H05K 2203/0235; H05K 2203/065; H05K 2203/08; H05K 3/4629; H05K 3/106; H05K 3/4602
See application file for complete search history.

(56) References Cited

U.S. PATENT DOCUMENTS

| | | | |
|---|---|---|---|
| 2004/0227227 A1* | 11/2004 | Imanaka | H05K 3/4602 257/692 |
| 2008/0053688 A1* | 3/2008 | Park | H05K 3/108 174/250 |
| 2015/0034590 A1* | 2/2015 | Takahashi | H05K 3/108 216/20 |

* cited by examiner

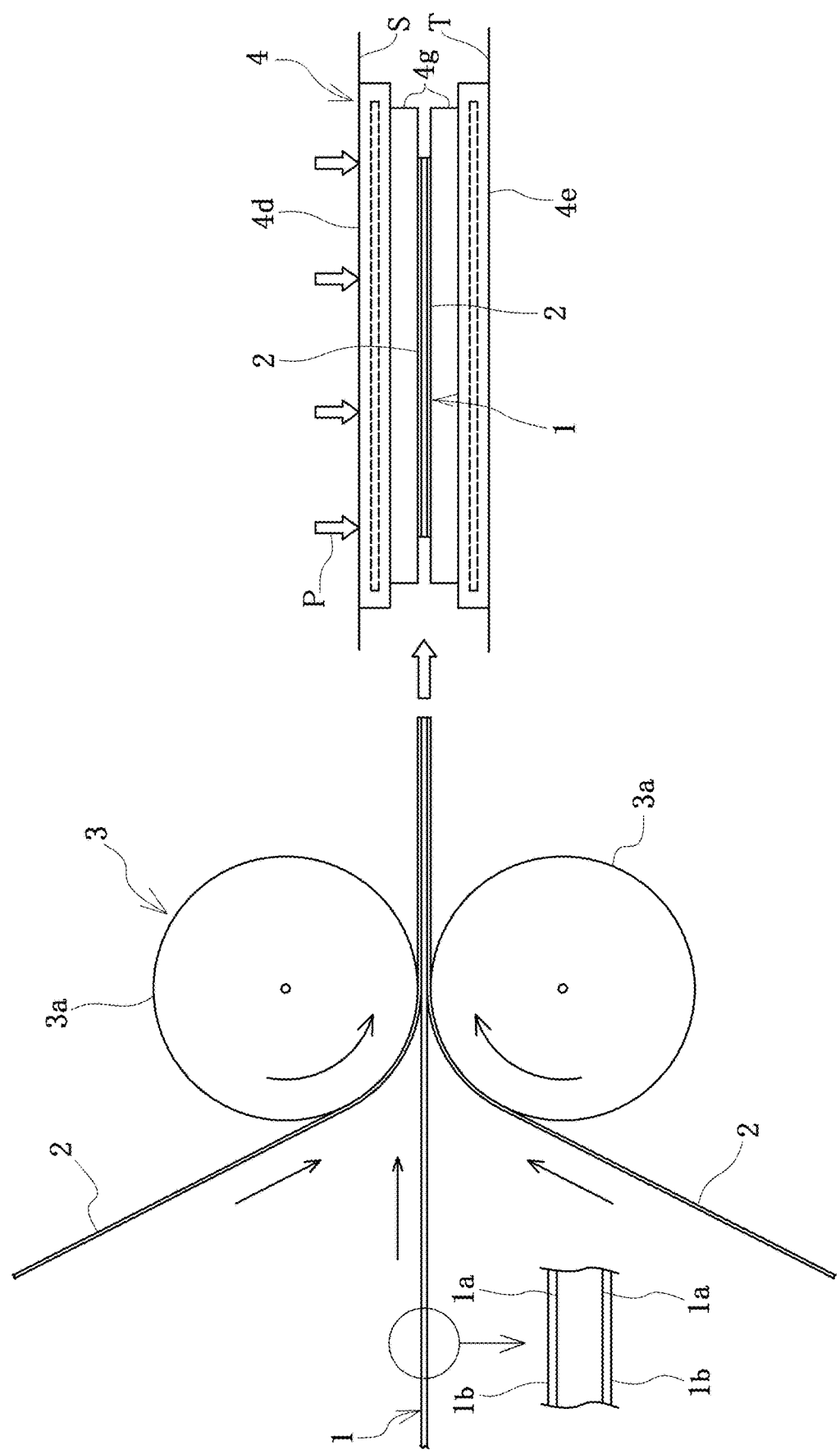

METHOD FOR MANUFACTURING PRINTED WIRING BOARD

CROSS-REFERENCE TO RELATED APPLICATIONS

The present application is based upon and claims the benefit of priority to Japanese Patent Application No. 2021-042012, filed Mar. 16, 2021, the entire contents of which are incorporated herein by reference.

BACKGROUND OF THE INVENTION

Field of the Invention

The present invention relates to a method for manufacturing a printed wiring board in which a dry film is laminated on a surface of a resin insulating layer for a printed wiring board, and relates to a laminating system used for implementing the method.

Description of Background Art

Japanese Patent Application Laid-Open Publication No. 2001-113629 describes a dry film laminating device for laminating a dry film on a copper-clad laminate. The entire contents of this publication are incorporated herein by reference.

SUMMARY OF THE INVENTION

According to one aspect of the present invention, a method for manufacturing a printed wiring board includes forming a seed layer on a surface of a resin insulating layer, applying a dry film onto the seed layer using a laminating roll device, cutting the dry film applied onto the seed layer to a predetermined size, applying a pressure and heat to the dry film applied onto the seed layer, forming a plating resist on the seed layer from the dry film using a photographic technology, forming an electrolytic plating film on part of the seed layer exposed from the plating resist, removing the plating resist from the seed layer, and removing the part of the seed layer exposed from the electrolytic plating film. The applying of the pressure and heat to the dry film applied onto the seed layer includes applying the pressure and heat to the dry film applied onto the seed layer such that the pressure and heat are applied to the entire surface of the dry film cut to the predetermined size simultaneously.

According to another aspect of the present invention, a laminating system includes a laminating device including a laminating roll device that applies a dry film onto a seed layer formed on a surface of a resin insulating layer, and a pressure application device positioned such that the pressure application device applies heat and pressure to the dry film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a side view of a laminating system for implementing a method for manufacturing a printed wiring board according to another embodiment of the present invention;

DETAILED DESCRIPTION OF THE EMBODIMENTS

Figure 1:
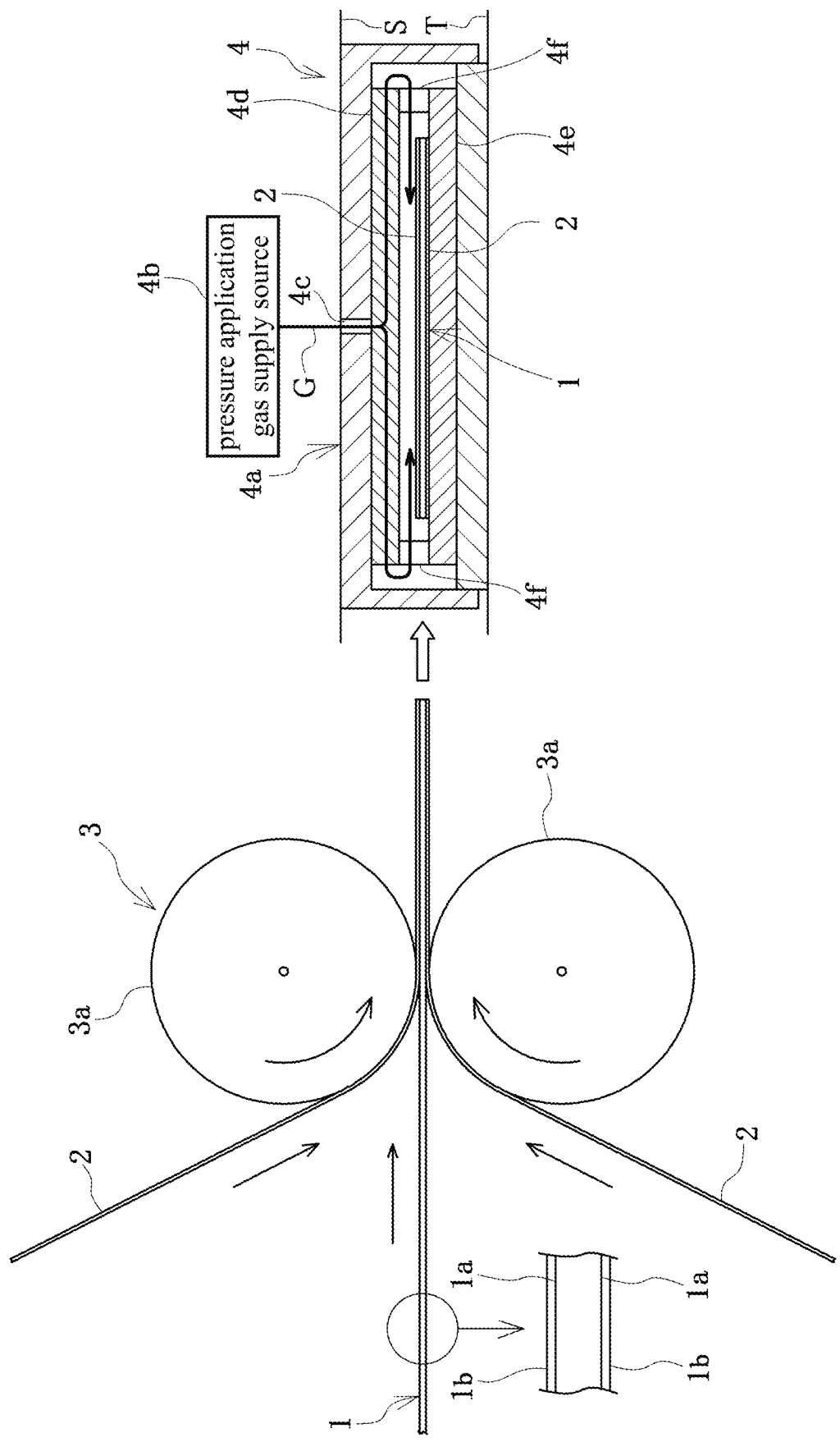
FIG. 1 is a cross-sectional view of a laminating system for implementing a method for manufacturing a printed wiring board according to an embodiment of the present invention.

Embodiments will now be described with reference to the accompanying drawings, wherein like reference numerals designate corresponding or identical elements throughout the various drawings.

FIG. 1 is a cross-sectional view illustrating a laminating system for implementing a method for manufacturing a printed wiring board according to an embodiment of the present invention. In FIG. 1, a reference numeral symbol "1" indicates, for example, a build-up type printed wiring board in which insulating layers and conductor layers are alternately laminated on both sides of a core substrate. As illustrated by enlarging a part of the printed wiring board 1, resin insulating layers (1a) each forming an insulating layer that covers a lower-layer conductor layer are respectively provided on both sides of the printed wiring board 1.

As the resin insulating layers (1a), for example, insulating resin films can be used, and, in particular, in order to meet a demand for reduction in transmission loss of high-frequency signals in recent years, it is desirable to use insulating resin films having a low surface roughness.

On surfaces of the resin insulating layers (1a) on both sides of the printed wiring board 1, seed layers (1b) are respectively formed, which later become power feeding layers when the conductor layers are formed by electrolytic copper plating. In the method for manufacturing a printed wiring board of this embodiment, before the seed layers (1b) are respectively formed on the surfaces of the resin insulating layers (1a), the surfaces of the resin insulating layers (1a) are roughened, and an arithmetic mean roughness (Ra) of the surfaces of the resin insulating layers (1a) after the roughening is 0.3 µm or less. The seed layers (1b) are formed, for example, by electroless copper plating.

Next, in the method for manufacturing a printed wiring board of this embodiment, the laminating system of the embodiment illustrated in FIG. 1 is used in order to respectively laminate photosensitive dry films 2, which later serve as plating resists when the conductor layers are formed by electrolytic plating, on the seed layers (1b) formed on the surfaces of the resin insulating layers (1a) on both sides of the printed wiring board 1.

The laminating system of this embodiment includes, for example, a laminating device 3 and a normal cutter (not illustrated in the drawings). In the laminating device 3, in a state in which, for example, a sheet-like printed wiring board 1 formed or cut into a predetermined shape such as a rectangular shape is positioned between two dry films 2 that are respectively unwound from two film rolls, the two dry films 2 and the printed wiring board 1 are sandwiched and carried by a pair of laminating rolls (3a), and the two dry films 2 are respectively applied by thermocompression bonding onto the seed layers (1b) formed on the surfaces of the resin insulating layers (1a) on both sides of the printed wiring board 1. The cutter cuts the dry films 2 that are respectively applied onto the seed layers (1b) on the surfaces of the resin insulating layers (1a) on both sides of the printed wiring board 1 to a predetermined size.

Here, the laminating device 3 includes: the pair of laminating rolls (3a) that are each formed by, for example, having a built-in infrared heater tube in a center portion of a steel cylindrical roll and lining an outer peripheral portion of the cylindrical roll with a heat-resistant silicone rubber to a thickness of 1 mm-4 mm; and a drive mechanism (not illustrated in the drawings) that drives the laminating rolls (3a) in mutually opposite directions. The laminating device 3 applies a pressure and heat to the two dry films 2 and the printed wiring board 1 sandwiched between the laminating rolls (3a) while carrying them to the right in the drawing.

The laminating system of this embodiment further includes a pressure application device 4 that applies a pressure to the printed wiring board 1, in which the dry films 2 that are respectively applied onto the seed layers (1b) on the surfaces of the resin insulating layers (1a) on the two sides have been cut to a predetermined size, in a state of having been heated.

Here, the pressure application device 4 includes: a pressure application container (4a) that is openable and closeable and accommodates in an airtight state the printed wiring board 1 in which the dry films 2 that are respectively applied onto the seed layers (1b) on the surfaces of the resin insulating layers (1a) on the two sides have been cut to a predetermined size; a pressure application gas (G) as a pressure source injected into the pressure application container (4a) from a pressure application gas supply source (4b) via a pressure application gas inlet (4c); an upper hot plate (4d) and a lower hot plate (4e) as heat sources heating in the pressure application container (4a) the printed wiring board 1 onto which the dry films 2 have been applied; a pressure application gas (G) that has been heated by the upper hot plate (4d) and the lower hot plate (4e); and a spacer (4f) that is inserted between a peripheral edge part of the upper hot plate (4d) and a peripheral edge part of the lower hot plate (4e) and forms a space in an up-down direction between the upper hot plate (4d) and the lower hot plate (4e).

The upper hot plate (4d) and the lower hot plate (4e) each have, for example, a built-in electric heater (not illustrated in the drawings). The pressure application gas (G) is supplied via the pressure application gas inlet (4c) of the pressure application container (4a) to the space between the upper hot plate (4d) and the lower hot plate (4e) as indicated by the arrows in the drawing. The pressure application gas (G) is, for example, compressed air. The pressure application gas supply source (4b) is, for example, a compressed air supply line, an air compressor, or the like.

In the method for manufacturing a printed wiring board of this embodiment using the laminating system of the embodiment, first, with the pair of laminating rolls (3a), of which surface temperatures have been adjusted to an optimum temperature in a range of, for example, 70° C.-140° C., of the laminating device 3, the dry films 2 are respectively applied by thermocompression bonding onto the seed layers (1b) formed on the surfaces of the resin insulating layers (1a) on both sides of the printed wiring board 1.

Next, the dry films 2 applied onto the seed layers (1b) on the surfaces of the resin insulating layers (1a) on both sides of the printed wiring board 1 are cut to a predetermined size that fits in the space surrounded by the upper hot plate (4d), the lower hot plate (4e), and the spacer (4f) with the cutter of the laminating device 3.

Next, between the upper hot plate (4d) and the lower hot plate (4e) positioned in the pressure application container (4a) of the pressure application device 4, the printed wiring board 1 (onto which the dry films 2 of a predetermined size have been applied) as an intermediate substrate during a manufacturing process of a printed wiring board as a product is positioned in a state of having a surrounding space formed by the spacer (4f). Then, the pressure application container (4a) is held, for example, on a table (T) of a normal pressing device by a slide (S) of the pressing device so as not to be opened by the pressure of the pressure application gas (G), and the printed wiring board 1 onto which the dry films 2 of a predetermined size have been applied is accommodated in the pressure application container (4a) in an airtight state.

Next, with respect to the entire dry films 2 of the predetermined size that are respectively applied to both sides of the printed wiring board 1, in the state in which the surrounding space is formed, a pressure is simultaneously applied by the pressure application gas (G) supplied from the pressure application gas inlet (4c) connected to the pressure application gas supply source (4b), and heat is simultaneously applied by the upper hot plate (4d) and the lower hot plate (4e) and the pressure application gas (G) heated by the upper hot plate (4d) and the lower hot plate (4e). The applying of the pressure and the heat to the dry films 2 is conducted after the applying of the dry films 2 onto the seed layers (1b). Further, the applying of the pressure and the heat to the dry films 2 is conducted before forming of plating resists to be described later. Due to the pressure application and the heat application, air bubbles trapped between the seed layers (1b) on the surfaces of the resin insulating layers (1a) and the dry films 2 when the dry films 2 are respectively applied onto the seed layers (1b) with the laminating rolls (3a) as described above are thought to dissolve in the dry films 2.

Next, the plating resists are respectively formed from the dry films 2 that are respectively applied onto the seed layers (1b) on the surfaces of the resin insulating layers (1a) on both sides of the printed wiring board 1 by exposure and development, which are photographic technologies. The plating resists have openings corresponding to conductor circuits formed in the printed wiring board 1. Next, electrolytic copper plating films are respectively formed on the seed layers (1b) exposed from the openings of the plating resists. After that, the plating resists are removed, and the seed layers (1b) that are exposed without being covered by the electrolytic copper plating films are removed. As a result, conductor circuits formed of the seed layers (1b) and the electrolytic copper plating films are formed on the surfaces of the resin insulating layers (1a) on both sides of the printed wiring board 1.

Example

In a method according to an example of the present invention, in the pressure application container (4a), a temperature of a surrounding atmosphere of the printed wiring board 1, in which the dry films 2 were respectively applied onto the seed layers (1b) formed on the surfaces of the resin insulating layers (1a) on the both sides having a low surface roughness, was raised to 45° C. or higher and 75° C. or lower by the upper hot plate (4d) and the lower hot plate (4e), and a pressure of the surrounding atmosphere was increased to 0.2 MPa or more and 0.6 MPa or less by the pressure application gas (G) from the pressure application gas inlet (4c), and a pressure application time was set to 20 seconds-30 seconds. According to the method of the example, voids due to air bubbles trapped between the seed layers (1b) on the surfaces of the resin insulating layers (1a) and the dry films 2 when the dry films 2 were respectively applied onto the seed layers (1b) with the laminating rolls (3a) disappeared after the pressure application and the heat application by the pressure application device 4.

Comparative Example

On the other hand, in a method of a comparative example, in the pressure application container (4a), the temperature of the surrounding atmosphere of the printed wiring board 1, in which the dry films 2 were respectively applied onto the seed layers (1b) formed on the surfaces of the resin insulating layers (1a) on the both sides having a low surface roughness, was raised to the room temperature or higher and 40° C. or lower by the upper hot plate (4d) and the lower hot plate (4e), and a pressure of the surrounding atmosphere was increased to 0.2 MPa or more and 0.6 MPa or less by the pressure application gas (G) from the pressure application gas inlet (4c), and a pressure application time was set to 20 seconds-3 minutes. In the method of the comparative example, voids due to air bubbles trapped between the seed layers (1b) on the surfaces of the resin insulating layers (1a) and the dry films 2 when the dry films 2 were respectively applied onto the seed layers (1b) with the laminating rolls (3a) remained even after the pressure application and the heat application by the pressure application device 4.

It is thought that the difference between the disappearance of the voids in the example and the remaining of the voids in the comparative example is due to that, according to Henry's law that, with respect to a gas component (B) under a constant temperature, the relation $P_B=K*x_B$ holds where $P_B$ is a pressure, $x_B$ is an amount of a dissolved substance, and K is a temperature-dependent constant (Henry constant), since an amount of a substance of a gas (air) that dissolves in a solvent (the dry films softened due to heat application) is proportional to a pressure with respect to a certain amount of the solvent under a constant temperature, dissolution and disappearance of the voids progresses when a pressure is applied.

Therefore, according to the method of this embodiment, air bubbles trapped between the seed layers (1b) on the surfaces of the resin insulating layers (1a) and the dry films 2 when the dry films 2 are respectively applied onto the seed layers (1b) on the surfaces of the resin insulating layers (1a) on both sides of the printed wiring board 1 can be effectively prevented from forming voids later.

FIG. 2 is a side view illustrating a laminating system for implementing a method for manufacturing a printed wiring board according to another embodiment of the present invention. In FIG. 2, parts that are the same as in FIG. 1 are indicated using the same reference numeral symbols.

That is, the reference numeral symbol "1" indicates, for example, a build-up type printed wiring board in which insulating layers and conductor layers are alternately laminated on both sides of a core substrate. As illustrated by enlarging a part of the printed wiring board 1, resin insulating layers (1a) each forming an insulating layer that covers a lower-layer conductor layer are respectively provided on both sides of the printed wiring board 1. On surfaces of these resin insulating layers (1a), seed layers (1b) are respectively formed, which later serve as power feeding layers when the conductor layers are formed by electrolytic copper plating.

As the resin insulating layers (1a), for example, insulating resin films can be used, and, in particular, in order to meet a demand for reduction in transmission loss of high-frequency signals in recent years, it is desirable to use insulating resin films having a low surface roughness.

In the method for manufacturing a printed wiring board of this embodiment, the laminating system of the embodiment illustrated in FIG. 2 is used in order to laminate photosensitive dry films 2 that later serve as plating resists when conductor layers are formed by electrolytic plating on the seed layers (1b) formed on the surfaces of the resin insulating layers (1a) on both sides of the printed wiring board 1.

Similar to the laminating system of the above-described embodiment, the laminating system of this embodiment includes a laminating device 3 and a normal cutter (not illustrated in the drawings). In the laminating device 3, in a state in which a printed wiring board 1 is positioned between two dry films 2, the two dry films 2 and the printed wiring board 1 are sandwiched and carried by a pair of laminating rolls (3a), and the two dry films 2 are respectively applied by thermocompression bonding onto the seed layers (1b) formed on the surfaces of the resin insulating layers (1a) on both sides of the printed wiring board 1. The cutter cuts the dry films 2 that are respectively applied onto the seed layers (1b) on the surfaces of the resin insulating layers (1a) on both sides of the printed wiring board 1 to a predetermined size.

The laminating system of this embodiment further includes a pressure application device 4 that applies a pressure to the printed wiring board 1, in which the dry films 2 that are respectively applied onto the seed layers (1b) on the surfaces of the resin insulating layers (1a) on the two sides have been cut to a predetermined size, in a state of having been heated.

Here, the pressure application device 4 includes: two flat pressing plates (4g) as a pressure source sandwiching from above and below the printed wiring board 1 in which the dry films 2 that are respectively applied onto the seed layers (1b) on the surfaces of the resin insulating layers (1a) on the two sides have been cut to a predetermined size; and an upper hot plate (4d) and a lower hot plate (4e) as heat sources heating, via the pressing plates (4g), the printed wiring board 1 onto which the dry films 2 have been applied. The two flat pressing plates (4g) are made of, for example, stainless steel. Further, the upper hot plate (4d) and the lower hot plate (4e) each have, for example, a built-in electric heater (not illustrated in the drawings).

In the method for manufacturing a printed wiring board of this embodiment using the laminating system of the embodiment, first, with the pair of laminating rolls (3a), of which surface temperatures have been adjusted to an optimum temperature in a range of, for example, 100° C.-120° C., of the laminating device 3, the dry films 2 are respectively applied by thermocompression bonding onto the seed layers (1b) on the surfaces of the resin insulating layers (1a) on both sides of the printed wiring board 1, and next, the dry films 2 applied onto the seed layers (1b) on the surfaces of the resin insulating layers (1a) on both sides of the printed wiring board 1 are cut to a predetermined size with the cutter of the laminating device 3.

Next, one of the two pressing plates (4g) of the pressure application device 4 is mounted, for example, on a table (T) of a pressing device via the lower hot plate (4e) of the pressure application device 4, and the other one of the two pressing plate (4g) of the pressure application device 4 is mounted on a slide (S) of the pressing device via the upper hot plate (4d) of the pressure application device 4. The printed wiring board 1 onto which the dry films 2 cut to a predetermined size have been applied is positioned between the pressing plates (4g). The upper hot plate (4d) is pressed toward the lower hot plate (4e) with the slide (S) of the pressing device with a pressing force as indicated by arrows (P) in the drawing. A pressure is simultaneously applied by the two pressing plates (4g) to the entire dry films 2 having a predetermined size applied onto the two sides of the printed wiring board 1, and heat is simultaneously applied by the upper hot plate (4d) and the lower hot plate (4e) via the two pressing plates (4g). The applying of the pressure and the heat to the dry films 2 is conducted after the applying of the dry films 2 onto the seed layers (1b). Further, the applying of the pressure and the heat to the dry films 2 is conducted before forming of plating resists to be described later.

After that, similar to the method of the above-described embodiment, the plating resists are respectively formed from the dry films 2 that are respectively applied onto the seed layers (1b) on the surfaces of the resin insulating layers (1a) on both sides of the printed wiring board 1 by exposure and development. The plating resists have openings corresponding to conductor circuits formed in the printed wiring board 1. Next, electrolytic copper plating films are respectively formed on the seed layers (1b) exposed from the openings of the plating resists. After that, the plating resists are removed, and the seed layers (1b) that are exposed without being covered by the electrolytic copper plating films are removed. As a result, conductor circuits formed of the seed layers (1b) and the electrolytic copper plating films are formed on the surfaces of the resin insulating layers (1a) on both sides of the printed wiring board 1.

Also according to the method of this embodiment, due to the pressure application and the heat application by the pressure application device 4, air bubbles trapped between the seed layers (1b) on the surfaces of the resin insulating layers (1a) and the dry films 2 when the dry films 2 are respectively applied onto the seed layers (1b) with the laminating rolls (3a) as described above are thought to dissolve in the dry films 2. As a result, the air bubbles trapped between the seed layers (1b) on the surfaces of the resin insulating layers (1a) and the dry films 2 when the dry films 2 are respectively applied onto the seed layers (1b) on the surfaces of the resin insulating layers (1a) on both sides of the printed wiring board 1 having a low surface roughness can be effectively prevented from forming voids later.

The above description is based on the illustrated embodiments. However, the method for manufacturing a printed wiring board and the laminating system of the present invention are not limited to the above-described embodiments, and can be appropriately modified within the scope of the claims. For example, the present invention can also be applied to laminating a dry film on a coreless multilayer printed wiring board, a single-layer printed wiring board, or a single-sided printed wiring board.

According to FIG. 2 of Japanese Patent Application Laid-Open Publication No. 2001-113629, the dry film laminating device of Japanese Patent Application Laid-Open Publication No. 2001-113629 includes a laminating roll, a post heating roll, and a cooling part.

A semi-additive method for forming conductor circuits may include laminating a dry film on a seed layer, forming a plating resist from the dry film by exposure and development, and forming an electrolytic plating film on the seed layer exposed from the plating resist.

Figure 3A:
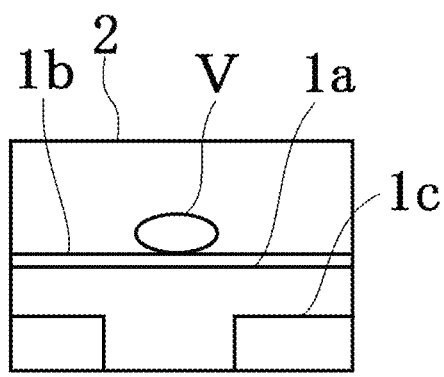
FIG. 3A is a cross-sectional view showing a state in which a void exists between a seed layer and a dry film.
Figure 3B:
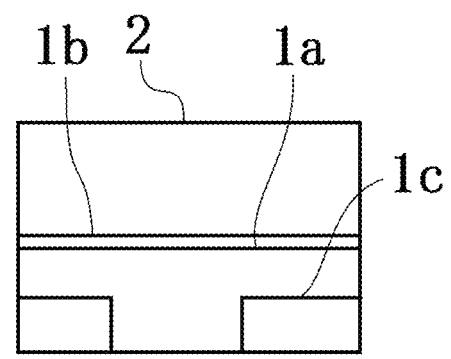
FIG. 3B is a cross-sectional view showing a state in which no void exists between the seed layer and the dry film.

It is difficult to manufacture conductor circuits with a yield of 100% using a semi-additive method including such processes. One of causes of defects is short circuiting. Then, one of causes of short circuiting is thought to be a void between a seed layer and a dry film on the seed layer. FIG. 3A illustrates an example of a void (V) between a seed layer (1b), which is formed on a surface of a resin insulating layer (1a) covering a lower-layer conductor layer (1c), and a dry film 2 laminated on the seed layer (1b). In the example of FIG. 3A, when an electrolytic plating film is formed on the seed layer (1b) exposed from a plating resist formed from the dry film 2, the electrolytic plating film is also deposited in the void (V) between the seed layer (1b) and the dry film 2. Therefore, conductor circuits adjacent to each other are connected by the electrolytic plating film in the void (V). On the other hand, in the example of FIG. 3B, there is no void (V) between the seed layer (1b) and the dry film 2.

A method for manufacturing a printed wiring board according to an embodiment of the present invention includes: preparing a resin insulating layer; forming a seed layer on a surface of the resin insulating layer; applying a dry film onto the seed layer using a laminating roll; cutting the dry film applied onto the seed layer to a predetermined size; applying a pressure and heat to the dry film applied onto the seed layer; forming a plating resist from the dry film using a photographic technology; forming an electrolytic plating film on the seed layer exposed from the plating resist; removing the plating resist; and removing the seed layer exposed from the electrolytic plating film.

The applying of the pressure and the heat to the dry film applied onto the seed layer is conducted simultaneously with respect to the entire surface of the dry film cut to a predetermined size.

Further, a laminating system according to an embodiment of the present invention includes a laminating device that applies a dry film onto a seed layer formed on a resin insulating layer using a laminating roll, and a pressure application device that applies heat and pressure to the dry film.

A method for manufacturing a printed wiring board according to an embodiment of the present invention includes preparing a resin insulating layer, forming a seed layer on a surface of the resin insulating layer, applying a dry film onto the seed layer using a laminating roll, cutting the dry film applied onto the seed layer to a predetermined size, applying a pressure and heat to the dry film applied onto the seed layer, forming a plating resist from the dry film using a photographic technology, forming an electrolytic plating film on the seed layer exposed from the plating resist, removing the plating resist, and removing the seed layer exposed from the electrolytic plating film.

In the method for manufacturing a printed wiring board of the embodiment, the applying of the pressure and the heat to the dry film may be conducted after the applying of the dry film onto the seed layer. In the method for manufacturing a printed wiring board of the embodiment, the applying of the pressure and the heat to the dry film may be conducted before the forming of the plating resist. Further, in the method for manufacturing a printed wiring board of the embodiment, the applying of the pressure and the heat to the dry film applied onto the seed layer may be conducted simultaneously with respect to the entire surface of the dry film cut to a predetermined size.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:

forming a seed layer on a surface of a resin insulating layer;

applying a dry film onto the seed layer using a laminating roll device;
cutting the dry film applied onto the seed layer to a predetermined size;
applying a pressure and heat to the dry film applied onto the seed layer;
forming a plating resist on the seed layer from the dry film using a photographic technology;
forming an electrolytic plating film on part of the seed layer exposed from the plating resist;
removing the plating resist from the seed layer; and
removing the part of the seed layer exposed from the electrolytic plating film,
wherein the applying of the pressure and heat to the dry film applied onto the seed layer comprises applying the pressure and heat to the dry film applied onto the seed layer such that the pressure and heat are applied to an entire surface of the dry film cut to the predetermined size simultaneously and that the applying of the pressure and heat to the dry film is conducted after the applying of the dry film onto the seed layer and includes applying the pressure to the dry film via a pressure application gas.

2. The method for manufacturing a printed wiring board according to claim 1, wherein the applying of the pressure and heat to the dry film is conducted before the forming of the plating resist.

3. The method for manufacturing a printed wiring board according to claim 2, wherein the applying of the pressure and heat to the dry film includes applying the heat to the dry film via the pressure application gas.

4. The method for manufacturing a printed wiring board according to claim 2, wherein the applying of the dry film includes forming an intermediate substrate, and the applying of the pressure includes putting the intermediate substrate in a pressure application container and putting the pressure application gas in the pressure application container.

5. The method for manufacturing a printed wiring board according to claim 4, wherein the applying of the pressure and heat to the dry film includes applying the heat to the dry film via the pressure application gas.

6. The method for manufacturing a printed wiring board according to claim 2, wherein the pressure application gas is compressed air.

7. The method for manufacturing a printed wiring board according to claim 2, further comprising:
roughening the surface of the resin insulating layer before the forming of the seed layer.

8. The method for manufacturing a printed wiring board according to claim 7, wherein the roughening the surface of the resin insulating layer comprises roughening the surface of the resin insulating layer such that an arithmetic mean roughness Ra of the surface of the resin insulating layer after roughening is 0.3 μm or less.

9. The method for manufacturing a printed wiring board according to claim 8, wherein the applying of the pressure and heat to the dry film includes applying the heat to the dry film via the pressure application gas.

10. The method for manufacturing a printed wiring board according to claim 1, wherein the applying of the pressure and heat to the dry film includes applying the heat to the dry film via the pressure application gas.

11. The method for manufacturing a printed wiring board according to claim 10, wherein the applying of the dry film includes forming an intermediate substrate, and the applying of the pressure includes putting the intermediate substrate in a pressure application container and putting the pressure application gas in the pressure application container.

12. The method for manufacturing a printed wiring board according to claim 10, wherein the pressure application gas is compressed air.

13. The method for manufacturing a printed wiring board according to claim 10, further comprising:
roughening the surface of the resin insulating layer before the forming of the seed layer.

14. The method for manufacturing a printed wiring board according to claim 13, wherein the roughening the surface of the resin insulating layer comprises roughening the surface of the resin insulating layer such that an arithmetic mean roughness Ra of the surface of the resin insulating layer after roughening is 0.3 μm or less.

15. The method for manufacturing a printed wiring board according to claim 1, wherein the applying of the dry film includes forming an intermediate substrate, and the applying of the pressure includes putting the intermediate substrate in a pressure application container and putting the pressure application gas in the pressure application container.

16. The method for manufacturing a printed wiring board according to claim 15, wherein the applying of the pressure and heat to the dry film includes applying the heat to the dry film via the pressure application gas.

17. The method for manufacturing a printed wiring board according to claim 15, wherein the pressure application gas is compressed air.

18. The method for manufacturing a printed wiring board according to claim 1, wherein the pressure application gas is compressed air.

19. The method for manufacturing a printed wiring board according to claim 1, further comprising:
roughening the surface of the resin insulating layer before the forming of the seed layer.

20. The method for manufacturing a printed wiring board according to claim 19, wherein the roughening the surface of the resin insulating layer comprises roughening the surface of the resin insulating layer such that an arithmetic mean roughness Ra of the surface of the resin insulating layer after roughening is 0.3 μm or less.

* * * * *